United States Patent [19]

Sakamoto et al.

[11] Patent Number: 4,719,581
[45] Date of Patent: Jan. 12, 1988

[54] SIGNAL PROCESSING UNIT

[75] Inventors: Hidenobu Sakamoto, Amagasaki; Masahiko Shimoda, 11-4, Yoshida 1-chome, Higashi-Osaka-shi, Osaka, both of Japan

[73] Assignees: Mitsubishi Denki Kabushiki Kaisha, Tokyo; Akira Hirai, Kyoto; Masahiko Shimoda, Osaka, all of Japan

[21] Appl. No.: 670,579

[22] Filed: Nov. 13, 1984

[30] Foreign Application Priority Data

Nov. 11, 1983 [JP] Japan ................... 58-213102

[51] Int. Cl.[4] ............... G01R 23/00; G01R 35/00; G01V 3/00
[52] U.S. Cl. .................... 364/485; 364/571; 324/307; 324/309; 324/312
[58] Field of Search ............... 364/485, 571; 324/307, 324/309, 312

[56] References Cited

U.S. PATENT DOCUMENTS

| 3,609,317 | 9/1971 | Siebert | 324/312 |
| 3,824,451 | 7/1974 | Freeman et al. | 324/312 |
| 4,303,979 | 12/1981 | Kato et al. | 364/485 |
| 4,321,537 | 3/1982 | Yokokawa | 324/312 |
| 4,340,862 | 7/1982 | Percival et al. | 324/309 |
| 4,418,316 | 11/1983 | Young et al. | 324/309 |
| 4,424,488 | 1/1984 | Hounsfield | 324/307 |
| 4,468,621 | 8/1984 | Hinshaw | 324/309 |

FOREIGN PATENT DOCUMENTS 2528591 1/1976 Fed. Rep. of Germany .
2737056 3/1978 Fed. Rep. of Germany .

OTHER PUBLICATIONS

Patent Associated Literature 2 Channel Analyzer for Mechanical Frequency and Phase Responses, W. P. Hohmann, Elektronik, vol. 24, No. 8, pp. 69-72, Aug. 1975, Germany.

Fourier Transform N.M.R. Spectroscopy, Derek Shaw, Varian Associates Ltd., Walton-On-Thames, Elsevier Scientific Publishing Band Selectable Fourier Analysis, H. Webber McKinney.

Primary Examiner—Felix D. Gruber
Assistant Examiner—Danielle Laibowitz
Attorney, Agent, or Firm—Oblon, Fisher, Spivak, McClelland & Maier

[57] ABSTRACT

A signal processing unit which employs a constant, continuous and automatic error correction. The prior manual calibration to eliminate errors is eliminated. An echo signal is employed for ease of design.

3 Claims, 4 Drawing Figures

SIGNAL PROCESSING UNIT

BACKGROUND OF THE INVENTION

The present invention relates to a signal processing unit for forming frequency spectrum by utilizing, for instance, nuclear magnetic resonance. More particularly, it relates to a signal processing unit for forming frequency spectrum by calibrating errors automatically.

For forming frequency spectrum by utilizing nuclear magnetic resonance without using any error-calibrating function, adjustment should be made as to an unit as follows. Namely, two reference signals having adjusted phase difference of 90° are respectively fed into two sensitive phase detectors, each having the same output signal, to carry out synchronous detection thereby outputting absorption components and dispersion components. In this case, there possibly takes place omission of signals because amplifiers have their inherent insensitive time. It is, therefore, necessary to carry out synchronous detection by producing an echo signal to prevent omission of the signals. The frequency spectrum is formed by subjecting detected outputs to signal processing in a computer device. When the detected signals are converted into a digital form in the computer device, each center of both the absorption components and the dispersion components of the echo signal should be in a digital form. In this case, control of meters and devices have to be made so as not to take place variations of the echo signal due to ageing of the amplifiers and the sensitive phase detectors whereby a signal at the front half portion or at the rear half portion with respect to the center of the echo signal is used for spectrum analysis. However, it is difficult either to perform phase adjustment of the reference signals so as to produce the absorption components and dispersion components from an output of the sensitive phase detector or to eliminate change in characteristic of the meters and devices due to the ageing of them. Further, it is also difficult to contrive so that the center of the echo signal has a digital value, on account of which there takes place difficulty in using a half portion of the signal with respect to the center of the echo signal for performing the spectrum analysis. This results in an error of frequency spectrum and it is, therefore, necessary to calibrate the error.

The operation of the conventional signal processing unit to perform calibration of errors will be described with reference to FIGS. 1 and 2.

FIG. 1 is a block diagram showing a construction of the conventional system.

The conventional signal processing unit comprises an amplifier 2 for amplifying a signal received by a receiver 1, a first distributor 3 for distributing an output from the amplifier 2 into two parts, a second distributor 6 for dividing an output from a phase shifter 5 which changes the phase of a reference signal output from an oscillator 4 into two parts, a first sensitive phase detector 8 for performing synchronous detection of an output of the first distributor 3 by an output of the second distributor 6 and a second sensitive phase detector 9 which performs synchronous detection of an output of the first distributor 3 by an output of a 90° phase shifter 7 which causes 90° phase-shift of an output of the second distributor 6 with respect to a reference signal input to the first phase detector 8.

A first A/D converter 10 and a second A/D converter 11 are provided to convert outputs of the first and second phase detectors 8, 9 into a digital form respectively. Outputs from the first and second A/D converters 10, 11 are supplied to a CPU 13 through an input circuit 15 to be stored in a memory 14, all of which constitute a computer device 12. The CPU 13 operates data stored in the memory 14 to output through an output circuit 16 to a CRT 17 which displays frequency spectrum.

FIG. 2 is a flow chart showing a program for forming frequency spectrum stored in the memory 14 of a computer device 12.

First of all, an echo signal is input to the first and second A/D converters 10, 11, where it is converted in a digital form. The digital signals are input into the input circuit 15 to start a signal inputting step 21. Upon receiving the signals from the input circuit 15, data to be processed $S_c(t)$ and $S_s(t)$ are prepared in a data preparation step 22.

$S_c(t) = \{\text{Output of first A/D converter (10)}\} 0 \leq t \leq tf$ $S_s(t) = \{\text{Output of second A/D converter (11)}\} 0 \leq t \leq tf$ Where $t=0$ is a starting time of A/D conversion of the echo signal; $t=tf$ is a finishing time of A/D conversion of the echo signal in which it is assumed that the neighborhood of the center of the echo signal is subjected to the A/D conversion at $t=0$ and the echo signal is too small to be subjected to the A/D conversion at $t=tf$.

The $S_c(t)$ and $S_s(t)$ can be expressed as described below if there is a 90° shift in phase between the reference signals of the first and second sensitive phase detectors 8, 9 and gain and characteristic of the detectors are same.

$$S_c(t) = \int_{-\infty}^{+\infty} Af(\Omega)\cos\{\Omega(t - t_0) - (t'\Omega + 0)\}d\Omega$$

$$S_s(t) = \int_{-\infty}^{+\infty} Af(\Omega)\sin\{\Omega(t - t_0) - (t'\Omega + 0)\}d\Omega$$

Where A is the magnitude of outputs from the first and second sensitive phase detectors 8, 9; $f(\Omega)$ is spectrum of an angular frequency $\Omega$ to be seeked; $t_0$ is deviation of time from the center of the echo signal to the first point of the same having been subjected to actual A/D conversion and $t'+O$ is an error by other causes.

Assuming that there is $$S(t) = A \int_{-\infty}^{+\infty} f(\Omega)e^{i\Omega t}d\Omega$$

without any error. Then, $t_0=0$ and $t'\Omega+O=0$ and accordingly, the following equation can be given.

$$S_c(t) + iS_s(t) = A \int_{-\infty}^{+\infty} f(\Omega)\cos\Omega t d\Omega +$$

$$iA \int_{-\infty}^{+\infty} f(\Omega)\sin\Omega t d\Omega$$

$$= S(t)$$

$F(\Omega)$ and $S(t)$ can be obtained by an inverse Fourier transformation. Real parts and imaginary parts of $S_c(t)$ and $S_s(t)$ are subjected to the inverse Fourier transformation in a data conversion step 23 to obtain $h(\Omega)$ as follows.

$$h(\Omega) = \frac{2}{2\pi A} \int_0^{tf} S(t)e^{-i\Omega t}dt$$

$$= \frac{2}{2\pi A} \int_0^{+\infty} \{S_c(t) + iS_s(t)\}e^{-i\Omega t}dt$$

$$= \frac{2}{2\pi A} \int_0^{+\infty} [S_c(t)\cos\Omega t + S_s(t)\sin\Omega t + i\{S_s(t)\cos\Omega t - S_c(t)\sin\Omega t\}]dt$$

$$= f(\Omega) + i\frac{2}{2\pi A} \int_0^{+\infty} \{S_s(t)\cos\Omega t - S_c\sin\Omega t\}dt$$

When a real part of $h(\Omega)$ is taken, there remains $f(\Omega)$, which is expressed by:

$f(\Omega)$ = the real part of $\{h(\Omega)\}$

In the conventional method, frequency spectrum is obtained by using the related equation.

When there is an error, the following expression can be made;

$$S_c(t) + iS_s(t) = A \int_{-\infty}^{+\infty} f(\Omega)\cos\{\Omega(t - t_0) - (t'\Omega + 0)\}d\Omega +$$

$$iA \int_{-\infty}^{+\infty} f(\Omega)\sin\{\Omega(t - t_0) - (t'\Omega + 0)\}d\Omega$$

$$= e^{-i0}S(t - t_0 - t')$$

Accordingly, $f(\Omega)$ and $S(t)$ can be obtained by using an inverse Fourier transformation. Real parts and imaginary parts of $S_c(t)$ and $S_s(t)$ are subjected to the inverse Fourier transformation in the data conversion step 23 to obtain $g(\Omega)$.

When we put $$h(\Omega) = \frac{2}{2\pi A} \int_0^{+\infty} S(t)e^{-i\Omega t}dt$$

$$= f(\Omega) + i\frac{2}{2\pi A} \int_0^{+\infty} \{S_s(t)\cos\Omega t - S_c(t)\sin\Omega t\}dt,$$

then, the following equations are obtainable.

$$g(\Omega) = \frac{2}{2\pi A} \int_0^{tf} \{S_c(t) + iS_s(t)\}e^{-i\Omega t}dt$$

$$= \frac{2}{2\pi A} \int_0^{+\infty} e^{-i0}S(t - t_0 - t')e^{-i\Omega t}dt$$

$$= \frac{2}{2\pi A} \int_{-t_0 - t'}^{+\infty} e^{-i\{0+\Omega(t_0+t')\}}S(t - t_0 - t')e^{-i\Omega(t - t_0 - t')} \times d(t - t_0 - t')$$

$$= \frac{2}{2\pi A} e^{-i\{0+\Omega(t_0+t')\}}\left(\int_0^{+\infty} + \int_{-t_0-t'}^0\right) S(t - t_0 - t') \times e^{-i\Omega(t-t_0-t')}d(t - t_0 - t')$$

$$= e^{-i\{0+\Omega(t_0+t')\}}\left\{h(\Omega) + \frac{2}{2\pi A} \int_{-t_0-t'}^0 S(t - t_0 - t') \times e^{-i\Omega(t-t_0-t')}d(t - t_0 - t')\right\}$$

Since $g(\Omega)$ obtained in the data conversion step 23 includes an error in the equations, a coefficient $e^{-i\{O+\Omega(t_0+t')\}}$ contained in the $g(\Omega)$ should be eliminated. In the date processing step 24, the product of $g(\Omega)$ and $e^{i\{O+\Omega(t_0+t')\}}$ is given on the assumption of the value of $O+\Omega(t_0+t')$. Then, the formula of $$h(\Omega) + \frac{2}{2\pi A} \int_{-t_0 - t'}^0 S(t - t_0 - t')e^{-i\Omega(t-t_0-t')}d(t - t_0 - t')$$

is obtained. Since a result obtained in the data processing step 24 is not provided as frequency spectrum, the result of the data processing step 24 is supplied to a calibration step 26 through a discrimination step 25, where calibration is carried out to make the item of $$\frac{2}{2\pi A} \int_{-t_0 - t'}^0 S(t - t_0 - t')e^{-i\Omega(t-t_0-t')}d(t - t_0 - t')$$

to be 0. The calibration in the calibration step 26 is not carried out based on any analysis but is carried out by a funtion obtained by experience. A frequency spectrum is obtained in the calibration step 26 and the real part of $h(\Omega)$ is taken in the course of from the discrimination step 25 to a spectrum outputting step 27; thus a spectrum $f(\Omega)$ is obtained. The spectrum obtained in the spectrum outputting step 27 is output to the CRT 17 through the output circuit 16 for a spectrum display step 28.

In the conventional method of calibration of error as above-mentioned, both values O and $t_0+t'$ are assumed and a finally remaining error is calibrated based on experience. Accordingly, there were disadvantageous such that a function for calibrating the error is artificially given and the echo signal can be utilized for only half portion when a signal processing unit was designed.

OBJECTS OF THE INVENTION

It is an object of the present invention to provide a signal processing unit which makes it unnecessary to put a function for calibrating error based on experience and makes the design of the unit easy in which frequency spectrum can be obtained by means of a data preparation means, a data conversion means and a spectrum preparation means by measuring an echo signal for sufficiently long time without putting parameters for calibration of error by presumption.

The foregoing object and the other objects of the present invention have been attained by providing a signal processing unit which comprises a receiver for receiving a signal, an amplifier for amplifying the signal received by the receiver, a distributor for dividing the signal amplified by the amplifier into two parts, two sensitive phase detectors which receive the two signal parts to perform synchronous detection of the input signals with reference to a reference signal from an oscillator, two A/D converters for converting outputs from the two phase detectors into a digital form, a data-preparation means for preparing data to be processed, by using the outputs from the two A/D convertors, a data converting means for performing data-conversion of the data to be peocessed which have been prepared by the data-preparation means and a spectrum forming means for performing automatical error-calibration of the data prepared by the data-converting means to form frequency spectrum.

DESCRIPTION OF THE PREFERRED EMBODIMENTS

An embodiment of the present invention will be described with reference to drawing.

Figure 1:
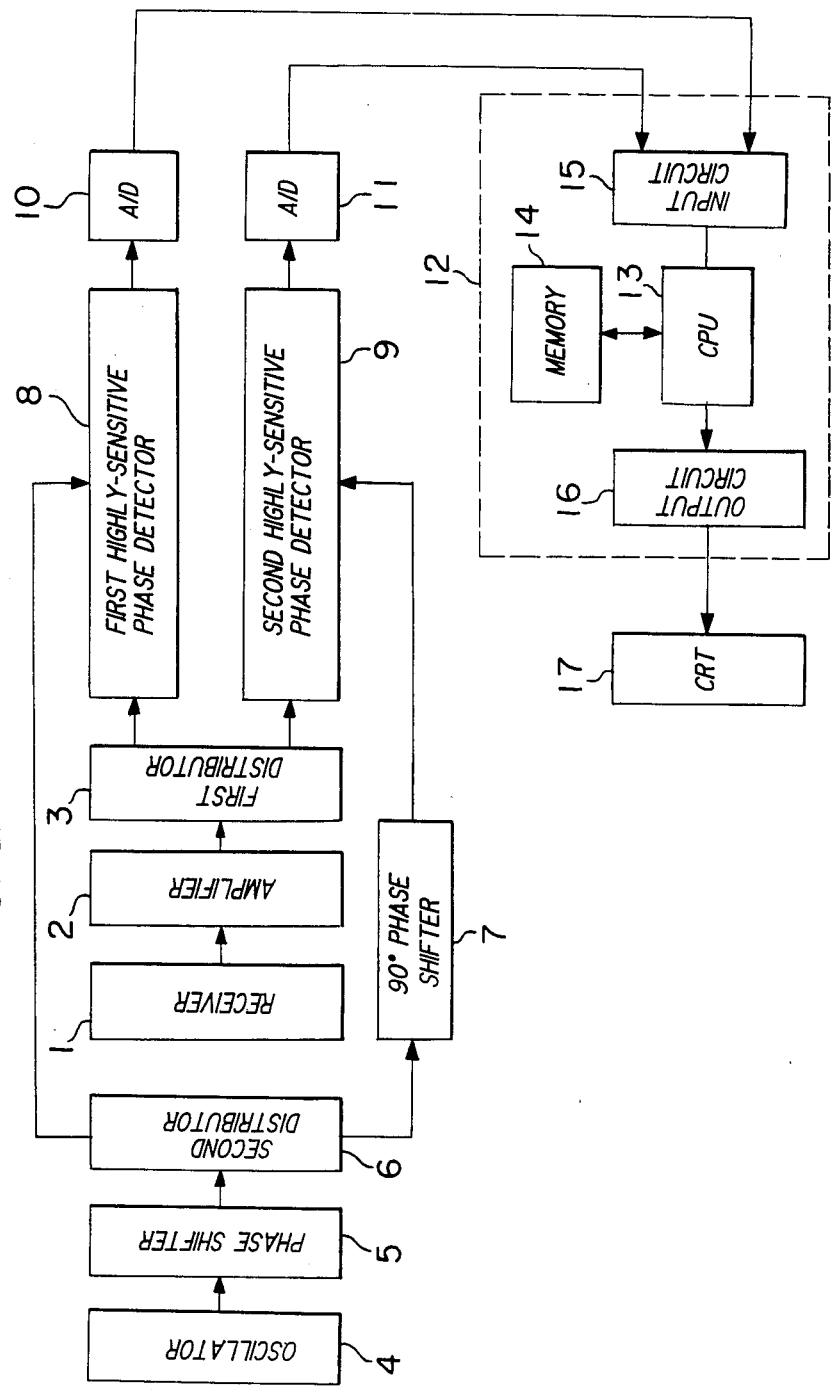
FIG. 1 is a block diagram of the construction of a conventional signal processing unit.
Figure 2:
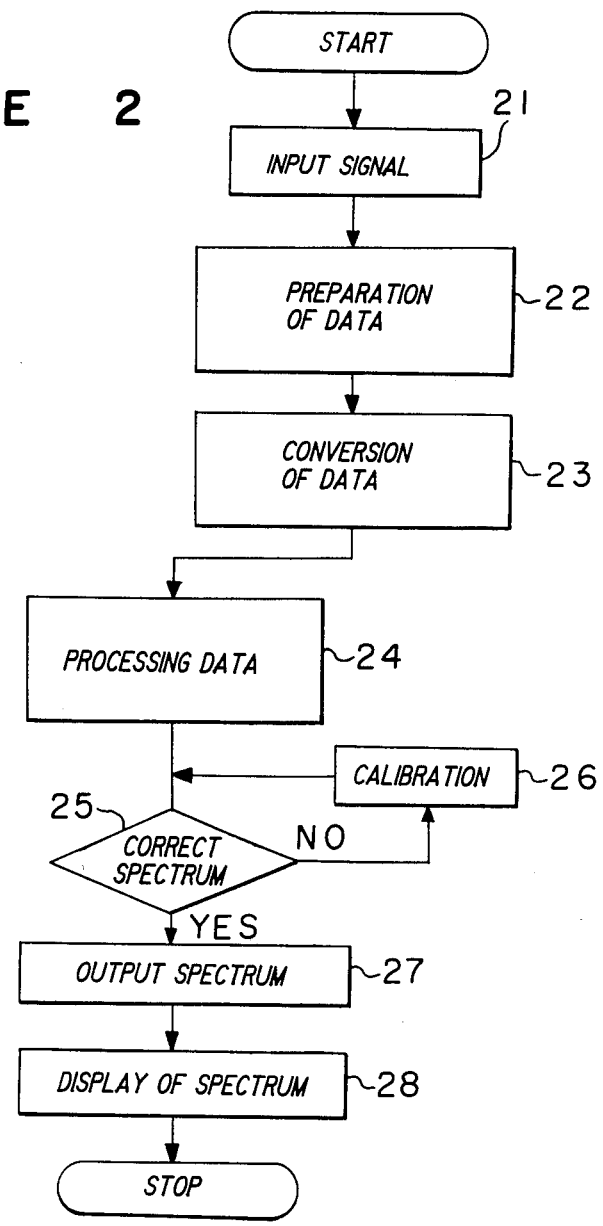
FIG. 2 is a flow chart showing steps for forming frequency spectrum.
Figure 3:
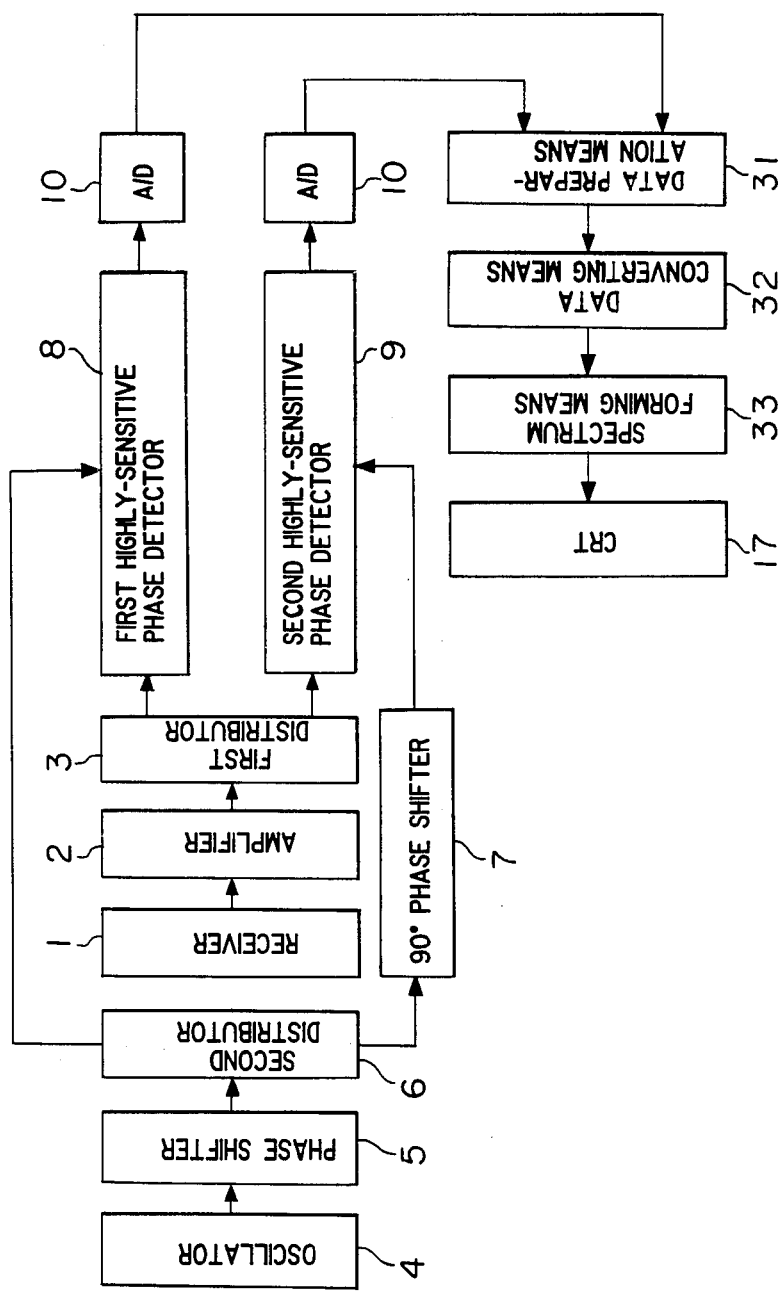
FIG. 3 is a block diagram of an embodiment of the signal processing unit according to the present invention and, FIG. 4 is a flow chart showing operations of the embodiment as in FIG. 3.

FIG. 3 is a block diagram of an embodiment of the signal processing unit according to the present invention. In FIG. 3, the structural elements indicated by reference numerals 1 to 11 are the same as those in FIG. 1. The signal processing unit of the present invention comprises in addition to the elements 1 to 11, a data-preparation means 31 for preparing data to be processed from outputs of the first and second A/D convertors 10, 11, a data converting means 32 for performing data conversion of the data to be processed prepared by the data-preparation means 31, a spectrum forming means 33 for forming frequency spectrum from the data prepared by the data conversion means 32 and a CRT 17 for displaying the frequency spectrum formed by the spectrum forming means 33. In the signal processing unit shown in FIG. 3, the first and second sensitive phase detectors 8, 9 are the same as used in the conventional unit in FIG. 1.

Figure 4:
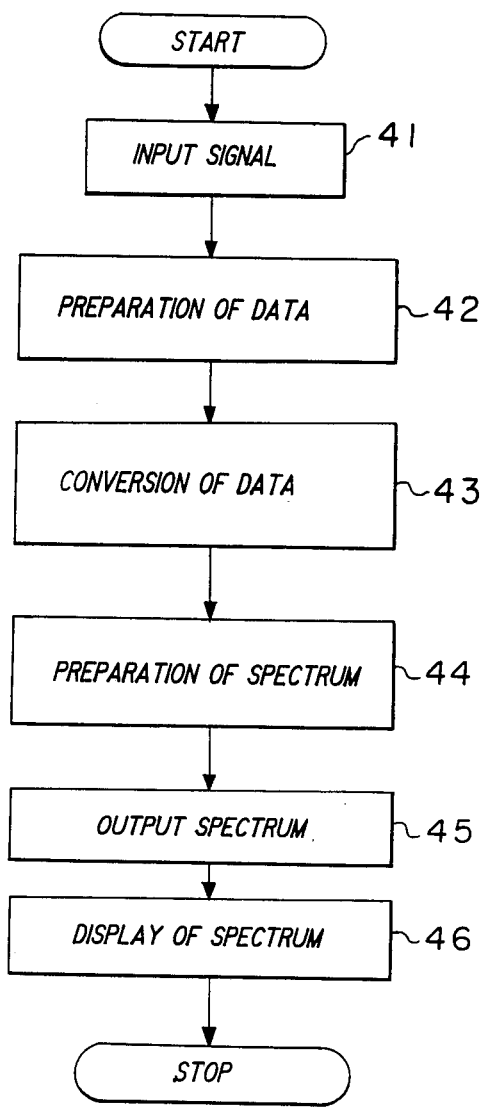

The operation of the embodiment will be described with reference to FIG. 4 which is a flow chart showing a program for forming frequency spectrum stored in the memory 14 of the computer device 12.

A signal inputting step 41 is started when parts of an echo signal converted into a digital form by the first and second A/D convertors 10, 11 are input into the input circuit 15. Upon receiving the signals, data to be processed $S_c(t)$ and $S_s(t)$ are prepared in a data-preparation step 42. $S_c(t)$ and $S_s(t)$ each including an error are expressed as follows.

$S_c(t) =$ {Output of the first A/D converter 10}
$0 \leq t \leq tf$ $S_s(t) =$ {Output of the second A/D converter 11}
$0 \leq t \leq tf$ Where $t=0$ is a starting time of A/D conversion of the echo signal; $t=tf$ is a finishing time of A/D conversion of the echo signal in which for $t=0$ and $t=tf$, the echo signal is too small to be subjected to A/D conversion and the echo signal is presence between $t=0$ and $t=tf$.

Since there is 90° deviation in phase between reference signals of the first and second sensitive phase detectors 8, 9, $S_c(t)$ and $S_s(t)$ can be expressed as follows.

$$S_c(t) = \int_{-\infty}^{+\infty} Af(\Omega)\cos\{\Omega(t - t_0) - (t'\Omega + 0)\}d\Omega$$

$$S_s(t) = \int_{-\infty}^{+\infty} Af(\Omega)\sin\{\Omega(t - t_0) - (t'\Omega + 0)\}d\Omega$$

Where A is the magnitude of outputs of the first and second sensitive phase detectors 8, 9; $t_0$ is time reaching the center of the echo signal subjected to A/D conversion and $f(\Omega)$ and $t'e+O$ are respectively frequency spectrum and an error as in the description of the conventional method.

When an equation $$S(t) = A \int_{-\infty}^{+\infty} f(\Omega)e^{i\Omega t}d\Omega$$

is put, then the following equations are established.

$$S_c(t) + iS_s(t) = A \int_{-\infty}^{+\infty} f(\Omega)\cos\{\Omega(t - t_0) - (t'\Omega + 0)\}d\Omega +$$

$$iA \int_{-\infty}^{+\infty} f(\Omega)\sin\{\Omega(t - t_0) - (t'\Omega + 0)\}d\Omega$$

$$= e^{-i0}S(t - t_0 - t')$$

$F(\Omega)$ and $S(t)$ can be obtained by an inverse Fourier transformation. The inverse Fourier transformation is applied respectively to the real parts and the imaginary parts of $S_c(t)$ and $S_s(t)$ to obtain $k(\Omega)$ as follows.

$$k(\Omega) = \frac{1}{2\pi A} \int_0^{tf} \{S_c(t) + iS_s(t)\}e^{-i\Omega t}dt$$

$$= \frac{1}{2\pi A} \int_{-\infty}^{+\infty} e^{-i0}S(t - t_0 - t')e^{-i\Omega t}dt$$

$$= \frac{1}{2\pi A} e^{-i\{0+\Omega(t_0+t')\}} \int_{-\infty}^{+\infty} S(t - t_0 - t')e^{-i\Omega(t-t_0-t')} \times d(t - t_0 - t')$$

$$= e^{-i\{0+\Omega(t_0+t')\}}f(\Omega)$$

With use of $k(\Omega)$ given in the data conversion step 43, a frequency spectrum $f(\Omega)=|k(\Omega)|$ is given in a spectrum preparation step 44. Since the spectrum $f(\Omega)$ is given to have the absolute value of an output of a data conversion step 43 by the spectrum preparation step 44, the spectrum $f(\Omega)$ is output from the output circuit 16 to the CRT 17 through a spectrum outputting step 45 followed by a spectrum display step 46 whereby frequency spectrum is displayed on the CRT 17.

In the embodiment, a computer device is used to form frequency spectrum. However, it is possible to use another calculating device.

What is claimed is:

1. A signal processing unit comprising:
   a receiver for receiving a signal;
   an amplifier coupled to said receiver for amplifying said received signal;
   a first distributor means coupled to said amplifier for producing two output signals from said amplified signal;
   an oscillator;
   a first phase shifter connected to said oscillator;
   a second distributor means coupled to said output of said phase shifter for producing a plurality of outputs;
   a second phase shifter coupled to one of said outputs of said second distributor means for shifting said signal 90°;
   two phase detectors each receiving one of said outputted signals from said first distributor means for performing synchronous detection of the outputted signals with one of said phase detectors being coupled to and responsive to a signal outputted by said second distributor means not passing through said second phase shifter and the other of said phase shifter that shifts said signal by 90°;
   two A/D converters each connected respectively to said phase detectors for converting the output of each of said phase detectors to a digital signal; and
   a digital processing means for accepting the digital signals produced by said A/D converters and for constantly and automatically producing an automatic error compensation of said received signal.

2. A processing unit as in claim 1, further comprises:
   a spectrum forming means for converting said received signal that has been error compensated into a displayable signal.

3. A processing unit as in claim 2, wherein said displayable signal is displayed on a CRT.

* * * * *